United States Patent [19]

Possin et al.

[11] Patent Number: 5,041,888

[45] Date of Patent: Aug. 20, 1991

[54] INSULATOR STRUCTURE FOR AMORPHOUS SILICON THIN-FILM TRANSISTORS

[75] Inventors: George E. Possin, Schenectady; Linda M. Garverick, Niskayuna, both of N.Y.

[73] Assignee: General Electric Company, Schenectady, N.Y.

[21] Appl. No.: 552,977

[22] Filed: Jul. 16, 1990

Related U.S. Application Data

[63] Continuation-in-part of Ser. No. 408,979, Sep. 18, 1989, abandoned.

[51] Int. Cl.$^5$ .................. H01L 45/00; H01L 27/22; H01L 29/78; H01L 27/01
[52] U.S. Cl. .................................... 357/23.7; 357/2; 357/4; 357/23.15; 357/54
[58] Field of Search .................. 357/2, 4, 23.7, 23.15, 357/54

[56] References Cited

U.S. PATENT DOCUMENTS

| | | | |
|---|---|---|---|
| 3,484,662 | 12/1969 | Hagon | 357/23.7 |
| 3,549,411 | 12/1970 | Bean et al. | 357/23.7 |
| 4,177,473 | 12/1979 | Ovshinsky | 357/4 |
| 4,618,541 | 10/1986 | Forouhi et al. | 357/54 |
| 4,870,470 | 9/1989 | Bass, Jr. et al. | 357/23.15 |

FOREIGN PATENT DOCUMENTS

| | | | |
|---|---|---|---|
| 60-86863 | 5/1985 | Japan | 357/23.7 |
| 62-73770 | 9/1985 | Japan | 357/23.7 |
| 63-1072A | 1/1988 | Japan | . |
| 64-68967 | 3/1989 | Japan | 357/23.7 |

OTHER PUBLICATIONS

Nam-Deog Kim et al., "Amorphous Silicon Thin-Film Transistors with Two-Layer Gate Insulator", *Applied Physics Letters*, vol. 54 (May 1989), pp. 2079-2081.

W. A. P. Claassen et al., "Characterization of Plasma Silicon Nitride Layer," *Journal of the Electrochemical Society*, vol. 130 (Dec. 1983), pp. 2419-2423.

G. M. Samuelson et al., "The Correlations Between Physical and Electrical Properties of PECVD SiN with their Composition Ratios", *Journal of the Electrochemical Society*, vol. 129 (Aug. 1982), pp. 1773-1778.

U.S. application Ser. No. 303,091 filed Jun. 1989 by Possin et al.

*Primary Examiner*—J. Carroll
*Attorney, Agent, or Firm*—Donald S. Ingraham; James C. Davis, Jr.; Marvin Snyder

[57] ABSTRACT

A thin-film field-effect-transistor (TFT) includes a gate electrode disposed on a substrate; a first thick layer of silicon nitride is disposed on the substrate and over the gate electrode and a second thinner layer of silicon nitride is disposed on the first layer. The first silicon nitride layer has a silicon-to-nitrogen concentration ratio selected to provide optimum structural characteristics, such as high density, high dielectric strength, low etch rate and the like, to the resulting TFT while the second silicon nitride layer has a silicon-to-silicon concentration ratio selected to provide a good electrical interface between the first silicon nitride layer and a subsequently deposited first layer of amorphous silicon. Another layer of doped amorphous silicon is formed on the first amorphous silicon layer and the second doped layer is patterned to form source and drain regions of the TFT. A source electrode and a drain electrode are respectively disposed in contact with the source and drain regions.

14 Claims, 6 Drawing Sheets

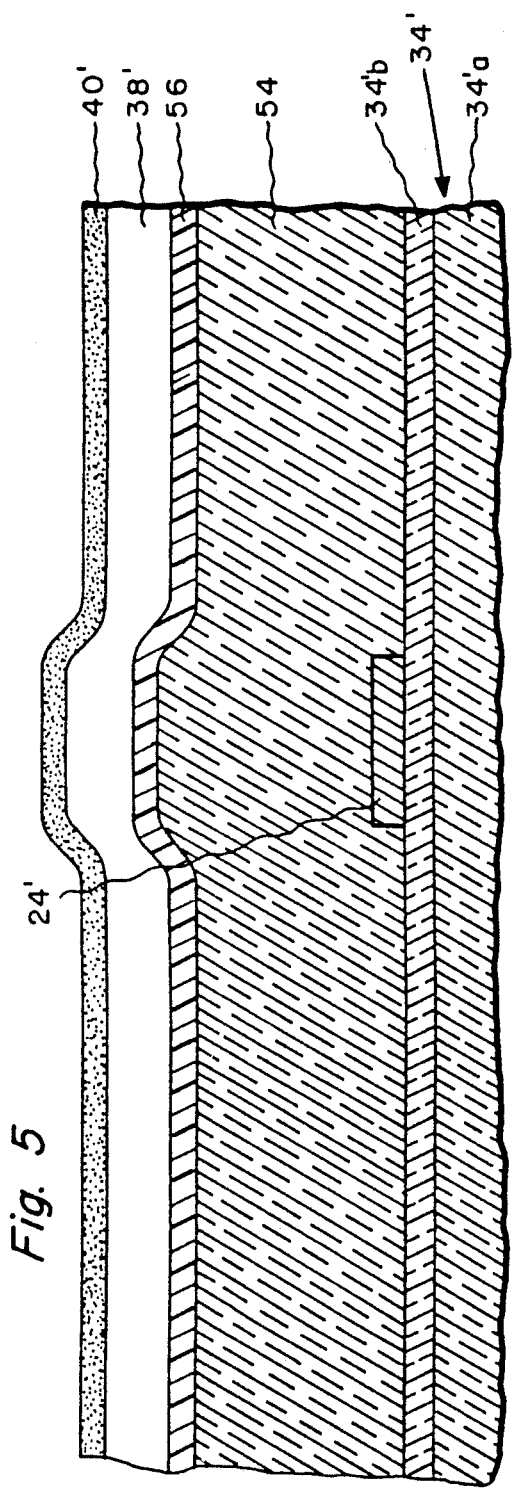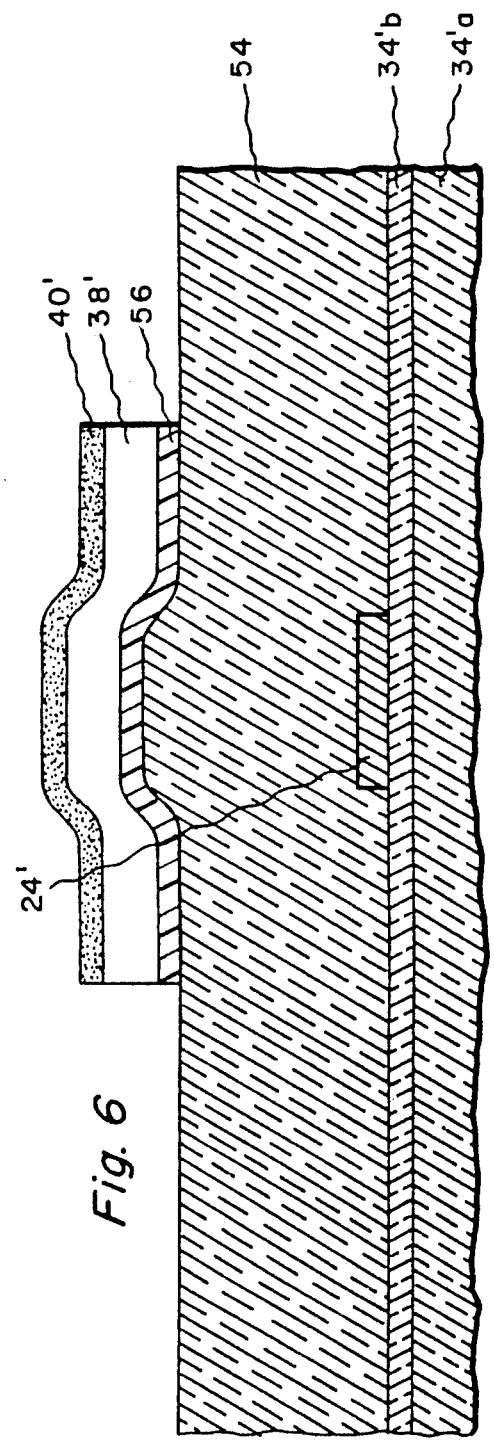

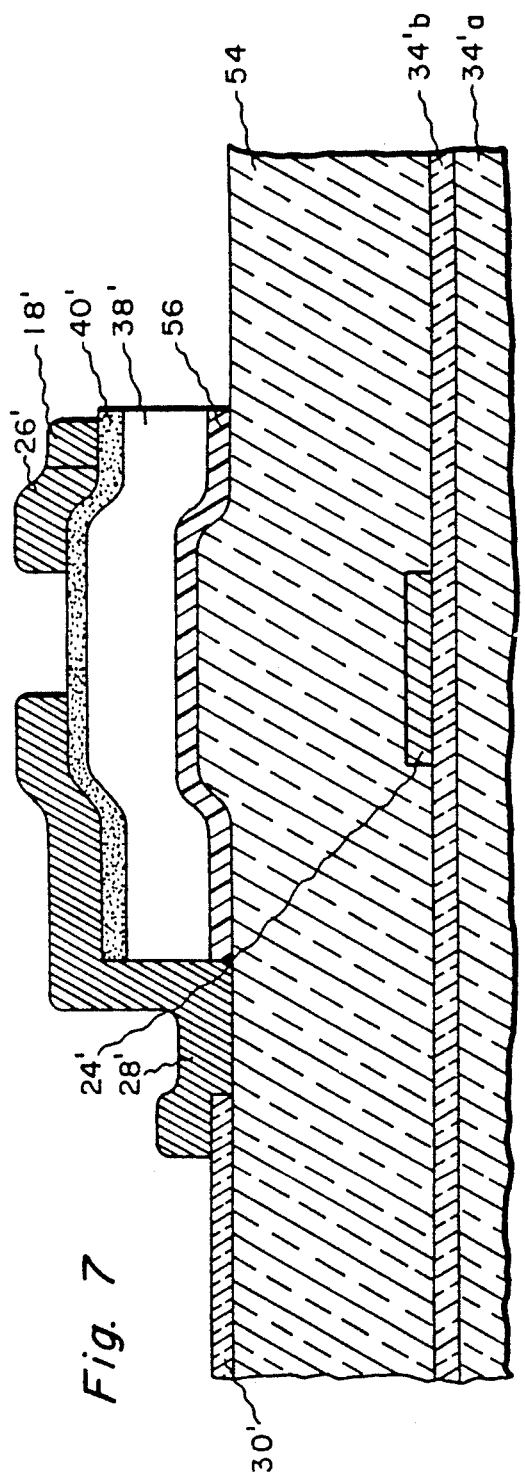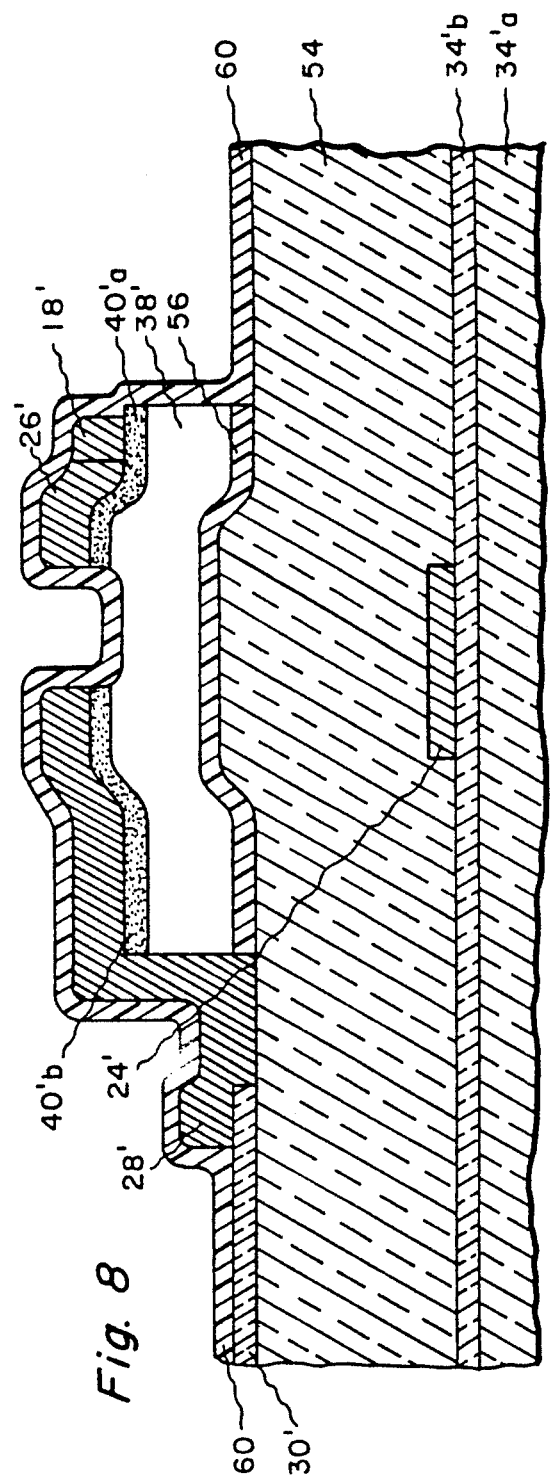

INSULATOR STRUCTURE FOR AMORPHOUS SILICON THIN-FILM TRANSISTORS

This application is a continuation in part of application Ser. No. 07/408,979, filed Sept. 18, 1989, now abandoned.

BACKGROUND OF THE INVENTION

The present invention relates to thin-film field-effect transistors and, more particularly, to an improved gate insulator structure for amorphous silicon (a-Si) thin-film field-effect transistors (FETs), such as may be employed in matrix addressed liquid crystal displays (LCD) and the like.

Thin-film FETs have a variety of applications; for example, one use of thin-film FETs is in LCD devices. A LCD device typically includes a pair of flat panels sealed at their outer edges and containing a quantity of liquid crystal material. Transparent electrode material, such as indium tin oxide (ITO) or the like, is typically disposed on the inner surfaces of the panels in predetermined patterns. One panel is often covered completely by a single transparent "ground plane" or "back plane" electrode and the opposite panel is configured with an array of transparent electrodes, referred to herein as "pixel" (picture element) electrodes; the pixel electrodes are usually arranged in uniform columns and rows to form an X-Y matrix structure. Thus, a typical cell in a LCD device includes liquid crystal material disposed between a pixel electrode and a ground electrode, and forming, in effect, a capacitor-like structure disposed between adjacent front and back panels.

If the LCD device is to operate by reflected light, then only one of the two panels and the electrodes disposed thereon need be light transmissive with the other panel and electrodes disposed thereon being formed from a light reflective material. If the LCD device is to operate by transmission of a backlight through the LCD, then both panels and the electrodes disposed thereon must be light transmissive.

In operation, the orientation of the liquid crystal material is affected by voltages applied between the pixel electrodes and the ground plane electrode, disposed on opposite sides of the liquid crystal material to cause an electric field to be formed therethrough responsive to the voltage. Typically, voltages applied to the pixel electrode effect a change in the optical properties of the liquid crystal material. This optical change facilitates the display of information on the screen of the liquid crystal display device.

While many forms of electrical mechanisms can be employed to turn on and off individual pixel elements of an LCD device, the utilization of thin-film field-effect transistors (TFTs), and especially those FETs employing a layer of amorphous silicon (a-Si), are preferred because of their potentially small size, low power consumption, high switching speed, ease of fabrication and compatibility with conventional LCD structures.

Electrical communication with the individual pixel FETs is accomplished by use of coincident addressing techniques using a plurality of X-address lines or scan lines, typically one for each row (or column) of pixels, and a plurality of Y-address lines or data lines, one for each column (or row) of pixels. The scan lines are usually connected to the gate electrodes of the pixel FETs and the data lines are usually connected to the source electrodes. The drain electrode of each FET is connected to the associated pixel electrode. An individual pixel may be addressed by applying a voltage of sufficient magnitude to one of the scan lines to cause the FETs in the row corresponding to that scan line to "switch-on" to a conducting state If a data voltage is applied to a data line while an FET in the column corresponding to the data line is in an "on" state, the pixel capacitor will charge and store the data voltage, which will remain present even after the scan line voltage has decreased to a level sufficient to turn off the FET. Each pixel in the display may be individually addressed in this manner. Depending upon the magnitude of the data voltage applied to the pixel electrode, the optical properties of the liquid crystal material may be altered. The data voltage magnitude may be such as to: allow no light transmission through the pixel (off); allow maximum light transmission through the pixel (on); or provide an intermediate gray scale level of light transmission.

A-Si TFTs, for use in LCD devices, are typically fabricated in an inverted staggered configuration by depositing and patterning a first layer of metallization to form the gate of each TFT, simultaneously with the scan lines which address the FETs in the LCD. A layer of gate insulation material, such as silicon nitride (SiN), silicon oxide (SiO) or the like, is deposited over the gate metallization; a first layer of a-Si is deposited over the gate insulation/dielectric layer and a second layer of doped a-Si is deposited over the first a-Si layer. The doped a-Si layer is patterned to form the source and drain regions of the FET. One particularly useful form of a field-effect transistor, having a two-layer gate insulator structure to improve the FET's structure and electrical characteristics, is disclosed and claimed in pending application Ser. No. 07/303,091, filed Jan. 26, 1989, assigned to the assignee of the present invention, and incorporated herein in its entirety by reference.

In any TFT, the gate insulation/dielectric layer(s) must perform the dual functions of: (1) providing good electrical performance characteristics when the FET is operational, such as good mobility of charge carriers and threshold voltage stability; and (2) providing structural integrity manifested as high breakdown voltage and low etch rates during device fabrication. No single material has yet been found which exhibits all of these desired qualities; therefore, a tradeoff is typically made between electrical performance and structural integrity.

The charge mobility in the conduction channel of a FET determines the switching speed of a FET; therefore, FETs having high mobilities are required in applications where fast switching is desired. Also, threshold voltage stability must be maintained if the device is to operate reliably. The conduction channel in a FET is formed in an interface region between the gate insulation/dielectric layer and the semiconductor material layer when the FET is operational; this interface region is typically a few hundred angstroms thick and it is the composition of this region that determines the electrical performance characteristics of the FET. An a-Si FET with an insulation/dielectric layer of silicon nitride, which is deposited by plasma enhanced chemical vapor deposition (PECVD) and which is rich in nitrogen (relative to the stoichiometric compound of $Si_3N_4$), will produce a device with acceptable electron mobility and threshold voltage stability. However, a silicon nitride layer which is rich in nitrogen will typically have poor structural integrity, which is an important concern in all applications and is particularly so in the fabrication of complex structures, such as LCD devices and the like. A nitride layer with poor structural integrity (rich in nitrogen) will be susceptible to the formation of structural defects, such as pinholes and the like which can lower the breakdown voltage and cause short-circuits between the a-Si layers and underlying conductive layers. Additionally, a nitride layer rich in nitrogen will exhibit a high etch rate in etchants such as buffered hydrofloric acid (BHF) and gaseous mixtures of carbon tetrafluoride ($CF_4$) and oxygen, relative to the overlying a-Si layers. High etch rates are undesirable because the a-Si and SiN layers are sometimes etched in the same masking step. If the SiN layer etches faster than the a-Si, the SiN layer will be undercut beneath the a-Si layer; this undercutting can cause step coverage problems when subsequent layers of material, such as the source and drain metallization layer and a passivation layer, are deposited. A faster SiN etch rate relative to silicon is also undesirable where design constraints and fabrication processes require only the silicon to be etched and for the etch to stop at the underlying nitride layer.

It is accordingly a primary object of the present invention to provide a thin-film transistor with a novel gate insulator structure which is not subject to the foregoing disadvantages.

It is another object of the present invention to provide a thin-film transistor with a novel gate insulator structure which has optimum electrical properties and structural properties.

It is a further object of the present invention to provide a thin-film transistor with a novel gate insulator structure which has process compatible etch properties and a high dielectric strength.

It is yet another object of the present invention to provide a thin-film transistor that has high charge mobility and threshold voltage stability.

These and other objects of the invention, together with the features and advantages thereof, will become apparent from the following detailed specification when read with the accompanying drawings in which like reference numerals refer to like elements.

SUMMARY OF THE INVENTION

In accordance with the present invention, a thin-film field-effect-transistor (TFT) includes a gate metallization layer, deposited on a substrate of an insulative material (such as glass or the like) and patterned to form a gate electrode. A first layer of silicon nitride (SiN), Having a thickness between about 1000–3000 angstroms, is deposited over the gate metallization layer. The first SiN layer has a silicon-to-nitrogen (Si:N) concentration ratio selected to provide a minimum etch rate and a high dielectric strength. The first SiN layer is preferably deposited by plasma enhanced chemical vapor deposition (PECVD) and preferably has a silicon density to provide an optical (or refractive) index above about 1.87. A second layer of SiN, having a thickness of about 200 angstroms or less, is deposited (as by PECVD) over the first SiN layer; the second SiN layer has a Si:N concentration ratio selected to provide optimum TFT performance, i.e., stability, charge mobility, threshold voltage stability and the like, and preferably has a silicon density to provide an optical index of about 1.87 and, therefore, has a lower Si:N ratio and is less dense and softer than the first SiN layer. The Si:N concentration ratios of the first and second SiN layers may be controlled primarily by the gas phase ratio of ammonia-to-silane used during deposition; the concentration ratio is also a function of the deposition pressure, the plasma power and substrate temperature. A first layer of amorphous silicon (a-Si) is deposited over the second SiN layer and a second layer of a-Si is deposited over the first a-Si layer and is doped to preferably have N+ type conductivity. At least the first and second a-Si layers and possibly the soft second SiN layer are patterned to form an island structure. The hard first SiN layer preferably acts as an "etch stop" to prevent any significant undercutting beneath the a-Si layer, which undercutting can cause step coverage problems when subsequent layers of material are deposited over the island structure. A source/drain metallization layer is deposited over the island structure and in electrical contact with the second doped a-Si layer. The source/drain metallization layer is patterned to form separate source and drain electrodes and to form an opening in the metallization layer which is aligned with the underlying gate electrode. The patterned source/drain metallization layer forms a mask through which the doped a-Si layer is patterned to form separate source and drain regions which each partially overlie the gate electrode. In operation, a voltage of proper polarity and magnitude applied to the gate electrode will enhance a conductive channel between the source and drain regions through the first a-Si layer.

In accordance with the present invention, a liquid crystal display (LCD) device includes a plurality of pixel cells each including a TFT structure having a first SiN layer overlying the gate metallization layer and a second SiN layer disposed between the first SiN layer and a subsequently deposited a-Si layer. The second SiN layer has a silicon density selected to provide optimum transistor performance and may have a thickness that is thin relative to the first SiN layer. The first SiN layer has a silicon density selected to provide a high dielectric strength and a minimum etch rate when etchants such as BHF, $CF_4$ plasmas and the like are used. A pixel electrode of light transmissive material, such as indium tin oxide or the like, is deposited and patterned on the first SiN layer and a source/drain metallization layer is deposited and patterned to provide a source electrode and a drain electrode in electrical contact with a portion of the pixel electrode. A layer of light transmissive passivation material, such as SiN, silicon oxide or the like, may be deposited over the pixel cell.

BRIEF DESCRIPTION OF THE DRAWINGS

FIGS. 5–8 are cross-sectional views of a portion of a LCD pixel cell showing the various steps of the fabrication process in accordance with the present invention.

DETAILED DESCRIPTION OF THE PREFERRED EMBODIMENTS

Figure 1:
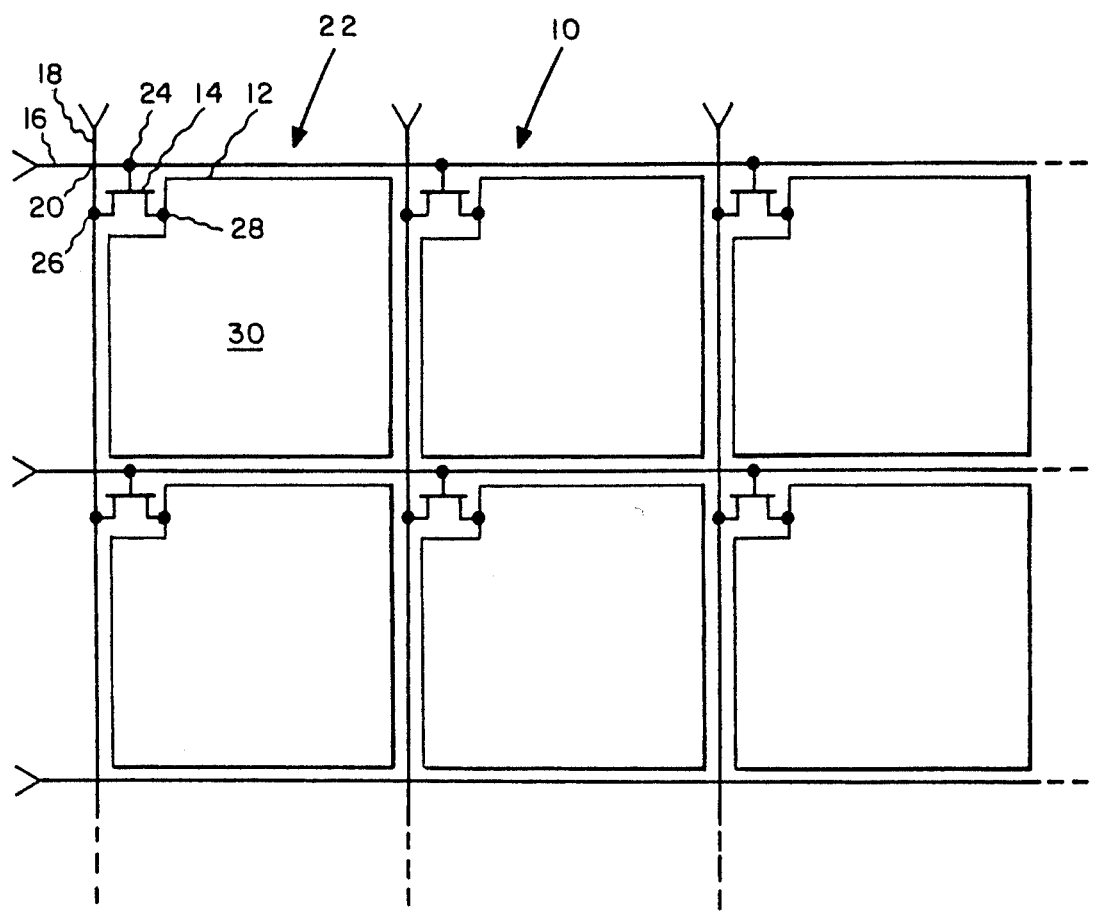
FIG. 1 is a schematic plan view of a portion of a thin-film transistor driven liquid crystal display device.

The use of thin-film field-effect-transistors (FETs) as electronic switching means for controlling the application of voltages to other components is known in the art. One particular application is to controllably turn on and off individual picture cells (picture elements or pixels) of a liquid crystal display (LCD). FIG. 1 is a schematic plan view of a portion of a LCD device 10 which is formed from an array of a multiplicity of pixels 12. The pixels 12 are usually arranged in uniform columns and rows to form an X-Y matrix-type structure. A FET 14 is typically formed with each pixel 12 to control operation of the light transmissive (or reflective) characteristics of the pixel. Electrical signals are communicated by a plurality of X-address lines 16, commonly referred to as gate lines or scan lines, and a plurality of Y-address lines 18, commonly referred to as source or data lines, to FETs 14 and pixels 12 for conversion to a visual signal. Typically, there is one scan line 16 for each row of pixels and one data line 18 for each column of pixels. Scan lines 16 usually run in one direction across the display and data lines 18 typically run in a direction substantially perpendicular to the scan lines; however, the scan and data lines may jog or snake back and forth if the pixel elements are staggered. Scan lines 16 and data lines 18 traverse each other at locations 20, known as crossovers and are spaced from each other at crossovers 20 by a layer of insulation.

Figure 2:
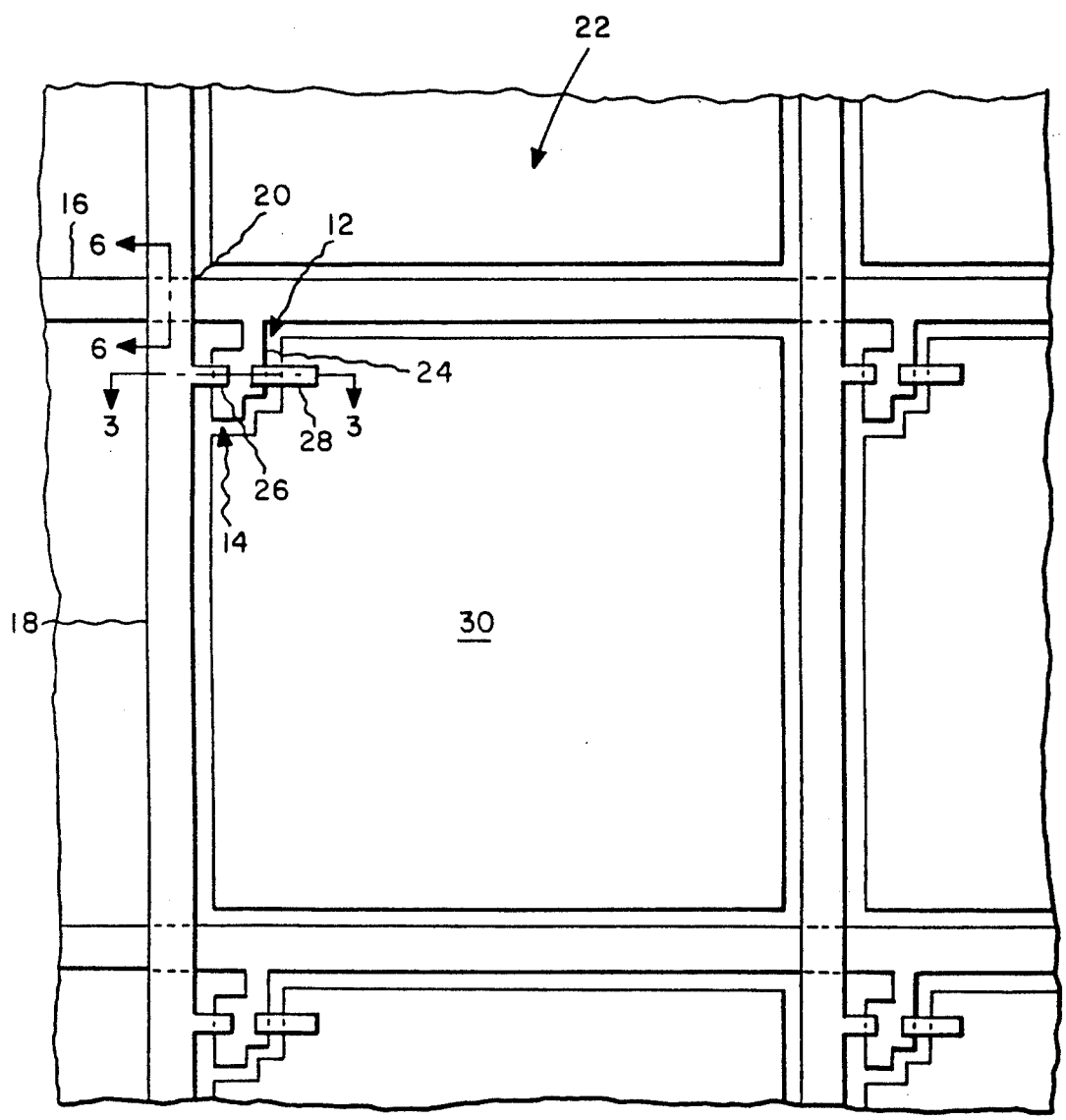
FIG. 2 is a detailed plan view of a portion of the LCD device of FIG. 1.

Referring also to FIG. 2, which is a detailed plan view of a single liquid crystal cell 22 of FIG. 1, a gate electrode 24 and a source electrode 26 of each FET 14 are respectively connected to a scan line 16 and a data line 18 for transferring electrical signals from the scan and data lines to pixel 12 for conversion to an optical signal. A drain electrode 28 of each FET 14 is connected to a pixel electrode 30 fabricated from a light transmissive material, such as indium tin oxide (ITO) and the like.

Figure 3:
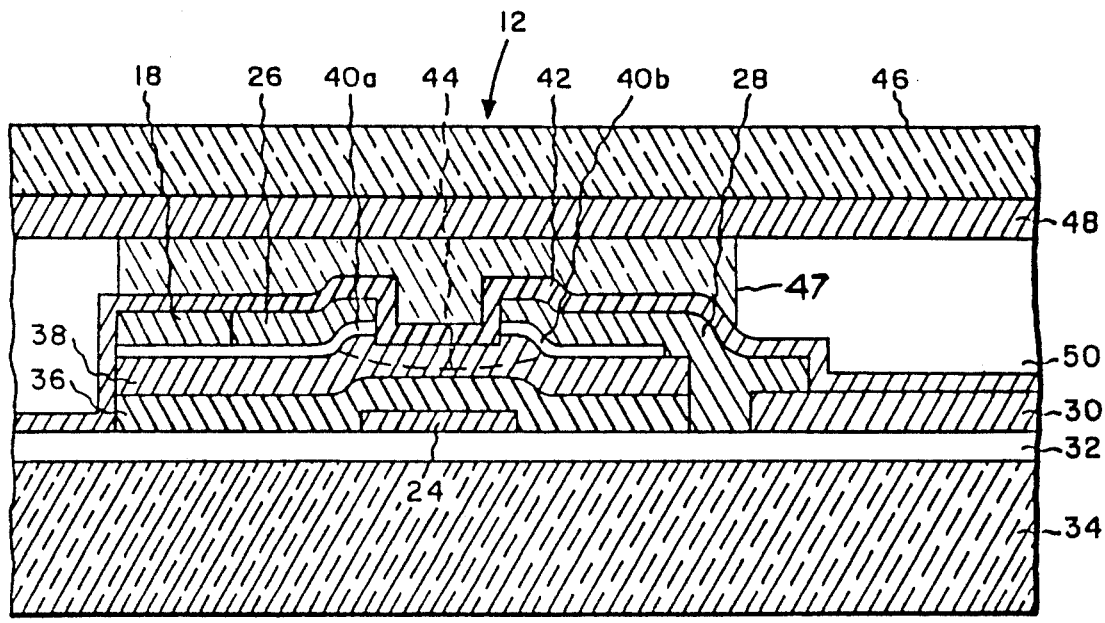
FIG. 3 is a cross-sectional view of a portion of a conventional liquid crystal cell of FIG. 2 taken along lines 3—3.

A cross-sectional view of a conventional FET 14 and a portion of a pixel 12 are shown in FIG. 3. While the pixel cell portion shown in FIG. 3 does not correspond to structures or processes embodied by the present invention, it is nonetheless instructive to consider it for the differences which will become apparent. A layer 32 of light transmissive, insulative material, such as silicon dioxide and the like, may be formed on a glass substrate 34. A FET gate electrode 24, and pixel electrode 30 are formed on insulation layer 32 by known photolithographic techniques. A layer 36 of silicon nitride ($Si_xN_y$) is deposited over gate 24 and a layer 38 of hydrogenated amorphous silicon (a-Si:H) is deposited over silicon nitride layer 36. Layers 36 and 38 are then patterned by known photolithographic techniques as shown in FIG. 3. If SiN layer 36 has a low Si to N concentration ratio selected to provide good electrical characteristics, i.e., good mobility and threshold voltage stability, then SiN layer 36 may be undercut by the etchants used which can cause step coverage problems when subsequent layers of material are deposited. Additionally, a low Si:N ratio causes an increased probability of structural defects such as pinholes which can create short-circuits and reduce yield. A heavily doped layer 40 of hydrogenated amorphous silicon is formed and patterned on layer 38 to form source region 40a and drain region 40b. Regions 40a and 40b preferably have N+ conductivity. Silicon nitride layer 36 and silicon layers 38 and 40 are preferably deposited by plasma enhanced chemical vapor deposition (PECVD) at a temperature of about 300° C. and pressure in the range of about 0.1–0.5 torr, which permits deposition of high quality films at much lower substrate temperatures than conventional CVD. This low-temperature process further permits the use of a glass substrate 34.

Figure 4:
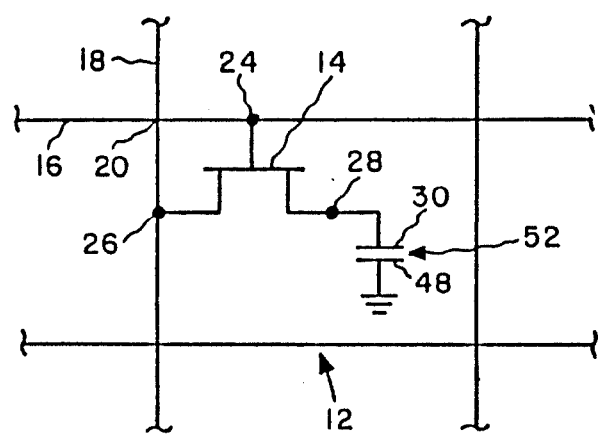
FIG. 4 is a schematic diagram of the equivalent circuit of a liquid crystal cell.

Metallization for data line 18, source electrode 26 and drain electrode 28 are preferably deposited and patterned at the same time; source electrode 26 is formed in contact with both data line 18 and source region 40a, and drain electrode 28 is deposited and patterned in contact with both drain region 40b and pixel electrode 30. A layer 42 of passivation material, such as silicon nitride or the like, is formed over the FET preferably by plasma deposition. A layer 46 of glass covers the liquid crystal display 10 and is spaced from the FET structure by a mechanical spacer 47 such as glass fibers, glass beads or the like. Thus, the FET and pixel are sandwiched between glass substrate 34 and cover glass 46. A ground plane electrode 48, which is common to all pixels in liquid crystal display 10, is formed on cover glass 46 at a spacing from pixel electrode 30. The volume 50 between electrodes 30 and 48 is filled with liquid crystal material and cover glass 46 is bonded to glass substrate 34 by a seal (not shown) at the perimeter of liquid crystal display 10. As shown in the cell equivalent circuit of FIG. 4, pixel electrode 30 and ground electrode 48 effectively form a pixel capacitor 52 connected between FET 14 and ground potential.

In operation, an individual pixel 12 (FIG. 4) may be addressed by applying a scan line voltage of proper polarity and magnitude to scan line 16 to enhance a conductive channel 44 (FIG. 3) across a-Si:H layer 38, between source region 40a and drain region 40b. If a data voltage is applied to data line 18 while the scan line voltage is sent, then pixel capacitor 52 will charge while the data voltage is also present and pixel capacitor 52 will store the charge after the scan line voltage has decreased to a level sufficient to deplete conductive channel 44 and switch FET 14 to a non-conductive state. This procedure is usually periodically repeated to refresh the charge on pixel capacitor 52; the LCD image is refreshed or updated at video rates, preferably about every $10^{-2}$ seconds or less, to maintain the image on the LCD and prevent flickering of the display. The quantity of light transmitted through pixel 12 is a function of the magnitude of the data line voltage applied to pixel electrode 30 and the charge on pixel capacitor 52.

In accordance with the present invention, a FET having an improved multiple-layer gate insulation/dielectric structure is formed by depositing a gate metallization layer 24' (FIG. 5) on substrate 34', preferably by sputtering. This substrate preferably includes a glass panel 34'a upon which a layer 34'b of light-transmissive insulation material, such as silicon oxide or the like, has been deposited. Gate metallization layer 24' is patterned and etched to produce gate electrode structures, scan lines and redundant gate metallization material (if desired). Redundant gate metallization is preferably provided so as to be eventually disposed beneath data lines 18. Redundant gate metallization patterns actually comprise individual electrically isolated island patterns, with gaps therebetween to permit passage of gate lines 16 (FIG. 2), which may be used to provide electrical circuit redundancy and increased yield. In the present invention, gate metal may comprise aluminum, gold, chromium, titanium and the like. In the case of titanium, gate metallization layer 24' may be plasma etched in a mixture of carbon tetrafluoride (CF$_4$) and 4 percent oxygen (by weight) Aluminum gate metallization material may be etched through the use of solutions such as PAWN (phosphoric, acetic and weak nitric acid solutions). FIG. 5 illustrates a portion of gate metallization layer 24', in the vicinity of an FET island, which corresponds to the FET gate electrode.

Figure 9:
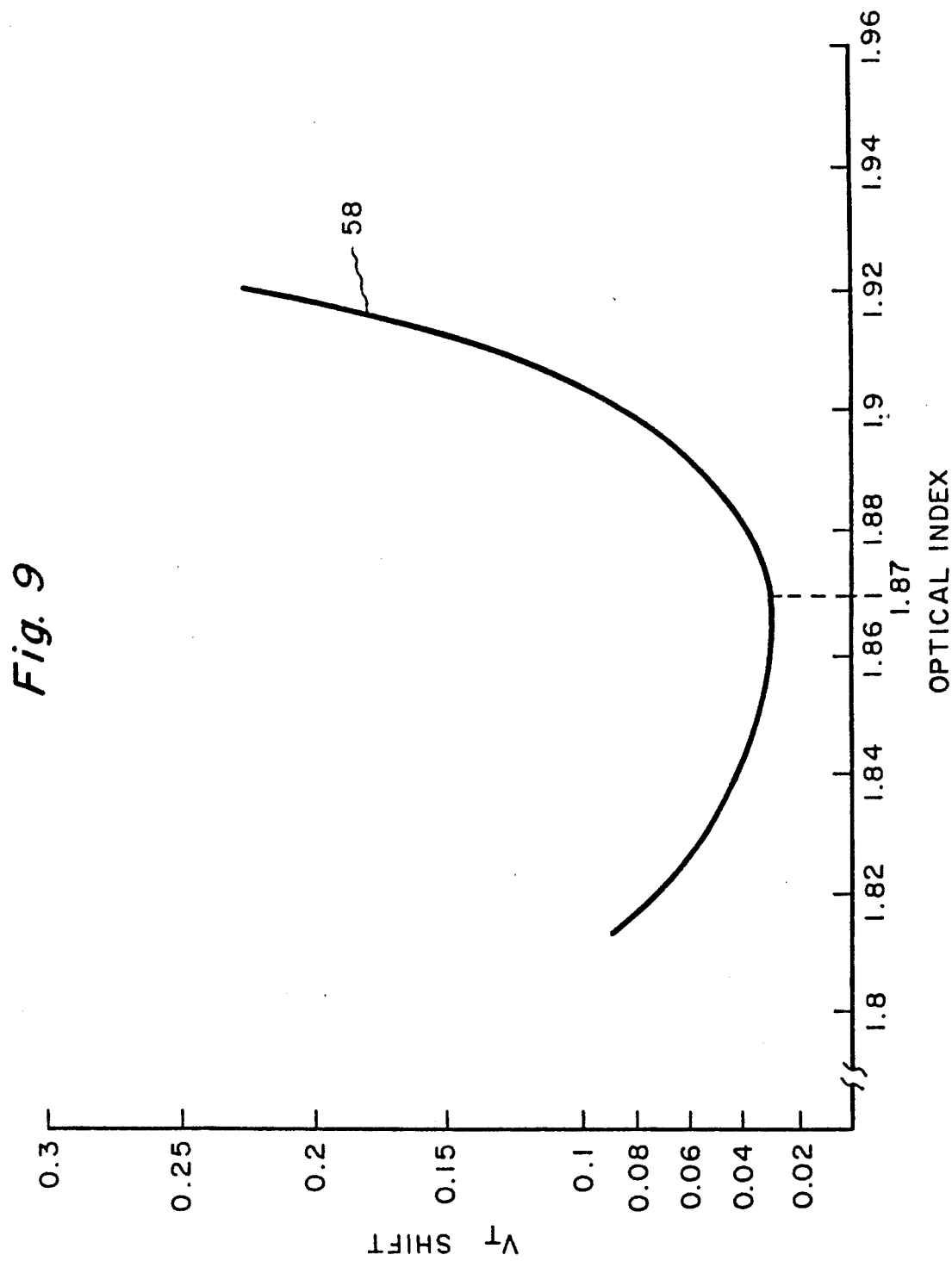
FIG. 9 is a graph showing the threshold voltage shift versus optical index for various Si:N concentration ratios.

A first layer 54 of SiN having a thickness of about 1000-3000 angstroms is deposited over gate metallization layer 24', preferably by PECVD. First SiN layer 54 should have a silicon-to-nitrogen concentration ratio which is sufficiently high (rich in silicon) to provide a minimum etch rate and a high dielectric strength. The density and hardness of layer 54 will increase with an increase in the silicon to nitrogen concentration, which will reduce the probability of structural defects (such as pinholes and the like) occurring. A second, thin layer 56 of SiN, having a thickness of about 200 angstroms or less, is deposited (preferably by PECVD) over the first SiN layer. Second SiN layer 56 has a silicon-to-nitrogen concentration ratio (Si:N) which is typically lower than the first SiN layer; the second layer Si:N concentration ratio is selected to provide a layer which is rich in nitrogen and therefore exhibits optimum FET performance, i.e., stability, charge mobility, threshold voltage stability and the like, when second layer 56 interfaces an amorphous silicon layer to be subsequently deposited. Since second SiN layer 56 is nitrogen rich relative to first layer 54 and has a lower Si:N concentration ratio than first layer 54, second SiN layer 56 also has a lower density and is softer than first SiN layer 54, which can result in structural defects; however, this possibility is of little concern because first SiN layer 54 is optimized to provide the desired structural integrity. The selected density or Si:N concentration of second SiN layer 56, which provides optimum electrical characteristics, can be determined by measuring the optical (or refractive) index of the layer, i.e., measuring the speed of light (at a wavelength of 6328 angstrom units) in the material relative to the speed of that light in a vacuum. An optical index of about 1.87 corresponds to a Si:N concentration which provides optimum electrical performance. To illustrate the optimum electrical performance of second SiN layer 56 (which has an optical index of about 1.87), the threshold voltage (V$_T$) shift was measured for different optical indices (which correspond to different Si:N concentration ratios). A curve 58 (shown in FIG. 9) was fit to the various points. The lowest V$_T$ shift is seen to be between an optical index of about 1.86 and 1.88. A higher Si:N concentration will have a correspondingly higher optical index and a higher V$_T$ shift, but will exhibit slower etch rates either during wet etching in BHF or during plasma etching in an atmosphere of CF$_4$ and O$_2$ in a plasma barrel etcher. Additionally, the higher optical index also corresponds to a higher breakdown strength and fewer pinholes. Thus, first SiN layer 54 should have an optical index higher than 1.87, preferably about 1.90 or higher at a wavelength of 6328 angstrom units, to provide optimum structural integrity.

Nitride layers 54 and 56 are preferably deposited by PECVD at a temperature of about 250°-300° C. and preferably a pressure of about 0.5 torr (although a deposition pressure in the range of 0.1-0.5 torr is also satisfactory) using ammonia and silane as source gases, although other gases such as disilane and nitrogen may be used as well. During this deposition process, the Si:N concentration ratios of first SiN layer 54 and second SiN layer 56 may be controlled primarily by the ammonia-to-silane gas phase ratio used during deposition of each layer; the concentration ratios may also be affected by the temperature at which the substrate is maintained during deposition, the processing pressure and the plasma power but these later three variables preferably remain constant for the deposition of each layer and only the gas phase ratio of ammonia to silane is changed. The settings for each of the variables may be different from one deposition apparatus or system to another, but the optical indices for each layer can be checked and the deposition equipment can be calibrated accordingly to provide the desired Si:N concentration ratio for each layer. The gas phase ratio may vary between about 4 and about 10 to provide the desired Si:N concentration ratio for each layer; the temperature is preferably about 300° C. and the pressure is preferably about 0.5 torr for a gas phase ratio between about 4 and about 10.

Referring back to FIG. 5, a layer 38' of semiconductor material, preferably amorphous silicon (a-Si), is deposited by PECVD on SiN layer 56 and a second layer 40' of semiconductor material, preferably also a-Si doped to have N+ conductivity, is deposited on first a-Si layer 38'. Semiconductor layers 38' and 40' preferably have a thickness of about 2000 and 500 angstroms, respectively.

Since the two nitride layers and the two a-Si layers are deposited by PECVD, the use of a plasma stimulates gas phase reactions and surface reactions to occur at lower processing temperatures than would be possible with traditional CVD methods. The lower processing temperatures permit the use of glass substrates which are cheaper and are available in arbitrary areas as compared to single crystalline silicon substrates. PECVD also permits the deposition of the multiple layers sequentially without breaking vacuum to provide interfaces between the layers which are substantially free of contaminants, such as oxygen, carbon and the like.

At least semiconductor layers 38' and 40' are then patterned and plasma etched, preferably in HCl gas; although other plasma etches such as SiCl$_4$, SF$_6$ and CF$_4$+O$_2$ may also be used. Second SiN layer 56 may also be plasma etched in HCl. First SiN layer 54 is not substantially etched because of its high density and hardness and remains over substantially the entire surface of the wafer. SiN layer 54 is particularly visible in FIG. 6 which also particularly indicates the early stage of the FET island formation.

Transparent pixel electrodes 30' (FIG. 7), preferably comprising indium tin oxide (ITO), are deposited and patterned either by etching or by lift off (if an LCD device is being fabricated). Note that in particular, wet etching of indium tin oxide is possible at this stage of fabrication since any gate level metallization is protected from the indium tin oxide etchant by SiN layer 54.

At this stage of processing, source/drain metallization, such as molybdenum, aluminum or the like, is deposited over the surface of the substrate, preferably by sputtering, and etched to form the source/drain and data line 18 patterns. A PAWN solution may be used to etch the molybdenum or aluminum source/drain metallization. The resultant structure is shown in FIG. 7 in which the source/drain metallization layer has been etched to produce source contact electrode 26' and drain contact electrode 28', both in electrical contact with N+ doped a-Si layer 40', as shown in FIG. 7. Subsequently, a portion of N+ a-Si 40' is removed from the channel region of the island structure, using electrodes 26' and 28' as a mask, to form an FET device with source region 40'a and drain region 40'b. Those skilled in the art will note that many FET structures are symmetric with respect to source and drain properties and that in many situations, the source and drain connections can be reversed; such is the case with the present invention as the source and drain designations are merely for purposes of convenience in describing the device. The substrate is capped with a layer 60 of passivating material, such as silicon nitride or the like, preferably deposited by plasma deposition. The resulting structure is shown in FIG. 8. It is noted that this process eliminates shorts between the gate or scan lines and the pixel electrodes or data lines due to excess metal or excess indium tin oxide because they are insulated from one another by SiN layer 54.

It will be readily understood by those skilled in the art that the present invention is not limited to the specific embodiments described and illustrated herein. Different embodiments and adaptations besides those shown herein and described, as well as many variations, modifications and equivalent arrangements will now be apparent or will be reasonably suggested by the foregoing specification and drawings, without departing from the substance or scope of the invention. While the present invention has been described herein in detail in relation to its preferred embodiments, it is to be understood that this disclosure is only illustrative and exemplary of the present invention and is made merely for purposes of providing a full and enabling disclosure of the invention. The thin-film transistor structure described herein is generally applicable and may be useful in other devices. The structure was merely described with respect to its application in an LCD device which is only one of many TFT uses. Accordingly, it is intended that the invention be limited only by the spirit and scope of the claims appended hereto.

What is claimed is:

1. A semiconductor device comprising:
    a substrate;
    a gate electrode disposed on said substrate;
    a first layer of silicon nitride disposed on said substrate and over said gate electrode, said first silicon nitride layer having a first silicon-to-nitrogen (Si:N) concentration ratio selected to provide optimum structural characteristics to said semiconductor device and having a first optical index corresponding to said first selected concentration ratio;
    a second layer of silicon nitride disposed on said first silicon nitride layer, said second silicon nitride layer having a second silicon-to-nitrogen (Si:N) concentration ratio selected to provide optimum electrical characteristics to said semiconductor device and having a second optical index corresponding to said second selected concentration ratio;
    said first optical index being greater than said second optical index;
    a first layer of amorphous silicon disposed on said second silicon nitride layer,
    a second layer of amorphous silicon disposed on said first silicon layer and doped to have a chosen conductivity;
    at least said second silicon layer being patterned to form a drain region and a source region, each of said regions partially overlying said gate electrode to cause a conductive channel between said source and drain regions through a portion of said first silicon layer lying therebetween when a voltage of proper polarity and magnitude is applied to said gate electrode relative to said source region;
    a source electrode in electrical contact with said source region; and
    a drain electrode in electrical contact with said drain region.

2. The device of claim 1 wherein said second Si:N ratio is selected to cause said second silicon nitride layer to have an optical index of about 1.87 at a wavelength of 6328 angstrom units when said second layer is deposited at a temperature between about 250° C. and about 300° C.

3. The device of claim 2 wherein said second silicon nitride layer has a thickness less than about 200 angstroms.

4. The device of claim 1 wherein said first Si:N ratio is selected to cause said first silicon layer to have an optical index at a wavelength of 6328 angstrom units not less than about 1.90 when said first layer is deposited at a temperature between about 250° C. and about 300° C.

5. The device of claim 4 wherein said first silicon nitride layer has a thickness between about 1000–3000 angstroms.

6. The device of claim 1 wherein said first silicon nitride layer has a higher dielectric strength and a lower etch rate than said second silicon nitride layer.

7. The device of claim 1 wherein said second silicon nitride layer provides high charge mobility and threshold voltage stability relative to said first silicon nitride layer when said device is operational.

8. A cell structure for liquid crystal displays, comprising:
    a substrate;
    a gate metallization layer disposed on said substrate and patterned to form a scan line and a gate electrode of a resulting thin-film transistor (TFT);
    a first layer of silicon nitride disposed on said substrate and over said gate metallization layer and having a first silicon-to-nitrogen (Si:N) concentration ratio selected to provide optimum structural characteristics to said resulting TFT and having a first optical index corresponding to said first selected concentration ratio;
    an island structure forming a remaining portion of said resulting TFT and comprising:
        (a) a second layer of silicon nitride disposed on said first silicon nitride layer and having a second silicon-to-nitrogen (Si:N) concentration ratio selected to provide optimum electrical characteristics to said resulting TFT and having a second optical index corresponding to said second selected concentration ratio;
        (b) a first layer of amorphous silicon disposed on said second silicon nitride layer;
        (c) a second layer of amorphous silicon disposed on said first silicon layer and doped to have a chosen conductivity;
            at least said second silicon layer being patterned to form a drain region and a source region, each of said regions partially overlying said gate electrode to cause a conductive channel between said source and drain regions through a portion of said first silicon layer when a voltage of proper polarity and magnitude is applied to said gate electrode relative to said source region;

said first optical index being greater than said second optical index;

a pixel electrode disposed on said first silicon nitride layer adjacent to said island structure; and a source/drain metallization layer disposed over said island structure, said first silicon nitride layer and partially over said pixel electrode, said source/drain metallization layer being patterned to connect one of said source and drain regions to said pixel electrode and the other of said source and drain regions to a data address line.

9. The cell structure of claim 8 wherein said second Si:N ratio is selected to cause said second silicon nitride layer to have an optical index of about 1.87 at a wavelength of 6328 angstrom units when said second layer is deposited at a temperature between about 250° C. and about 300° C.

10. The cell structure of claim 9 wherein said second silicon nitride layer has a thickness less than about 200 angstroms.

11. The cell structure of claim 8 wherein said first Si:N ratio is selected to cause said first silicon nitride layer to have an optical index at a wavelength of 6328 angstrom units not less than about 1.90 when said first layer is deposited at a temperature between about 250° and 300° C.

12. The cell structure of claim 11 wherein said first silicon nitride layer has a thickness between about 1000-3000 angstroms.

13. The cell structure of claim 8 wherein said first silicon nitride layer has a higher dielectric strength and a lower etch rate than said second silicon nitride layer.

14. The cell structure of claim 8 wherein when said device is operational said second silicon nitride layer provides higher charge mobility and threshold voltage stability than a device having only said first silicon nitride layer.

* * * * *